(12) United States Patent
Penth et al.

(10) Patent No.: US 8,964,493 B2
(45) Date of Patent: Feb. 24, 2015

(54) DEFECTIVE MEMORY COLUMN REPLACEMENT WITH LOAD ISOLATION

(71) Applicant: International Business Machines Corporation, Armonk, NY (US)

(72) Inventors: Silke Penth, Holzgerlingen (DE); Raphael Polig, Dietikon (CH); Tobias Werner, Weil im Schoenbuch (DE); Alexander Woerner, Boebingen (DE)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 13/733,948

(22) Filed: Jan. 4, 2013

(65) Prior Publication Data

US 2014/0192602 A1    Jul. 10, 2014

(51) Int. Cl.
  G11C 29/00    (2006.01)
  G11C 17/18    (2006.01)
  G11C 29/04    (2006.01)
(52) U.S. Cl.
  CPC ..................................... *G11C 29/04* (2013.01)
  USPC ........................................ 365/200; 365/225.7
(58) Field of Classification Search
  USPC .............................................. 365/200, 225.7
  See application file for complete search history.

(56) References Cited

U.S. PATENT DOCUMENTS

| | | | | |
|---|---|---|---|---|
| 5,274,593 A | * | 12/1993 | Proebsting | 365/200 |
| 6,058,052 A | * | 5/2000 | Steadman | 365/200 |
| 6,163,489 A | * | 12/2000 | Blodgett | 365/200 |
| 6,728,149 B2 | * | 4/2004 | Akamatsu | 365/200 |
| 6,804,135 B1 | * | 10/2004 | Srinivasan et al. | 365/200 |
| 7,843,746 B2 | * | 11/2010 | Ryu | 365/200 |
| 2012/0008426 A1 | | 1/2012 | Demone | |
| 2012/0057414 A1 | | 3/2012 | Park et al. | |
| 2012/0069688 A1 | | 3/2012 | Behrends et al. | |
| 2012/0075943 A1 | | 3/2012 | Chen et al. | |

OTHER PUBLICATIONS

Cao et al. "Efficient built-in self-repair strategy for embedded SRAM with selectable redundancy," 2012 2nd International Conference on Consumer Electronics, Communications and Networks (CECNet), pp. 2565-2568, Apr. 21-23, 2012, IEEE. doi: 10.1109/CECNet.2012.6201846.

Kim et al. "Analyzing the Impact of Joint Optimization of Cell Size, Redundancy, and ECC on Low-Voltage SRAM Array Total Area," IEEE Transactions on Very Large Scale Integration (VLSI) Systems, vol. 20, No. 12, pp. 2333-2337, Dec. 2012. doi: 10.1109/TVLSI.2011.2173220.

* cited by examiner

*Primary Examiner* — Trong Phan
(74) *Attorney, Agent, or Firm* — Daniel Simek

(57) ABSTRACT

Exemplary embodiments of the present invention disclose a method and system for substituting a group of memory cells for a defective group of memory cells in a memory. In a step, an exemplary embodiment replaces a signal path to a group of defective memory cells with a signal path to a redundant group of memory cells. In another step, an exemplary embodiment isolates the signal path to the redundant group of memory cells from a load imposed by the signal path to the replaced group of defective memory cells.

20 Claims, 4 Drawing Sheets

DEFECTIVE MEMORY COLUMN REPLACEMENT WITH LOAD ISOLATION

FIELD OF THE INVENTION

The present invention relates generally to the design of memory and more specifically to the design of semiconductor SRAM memory.

BACKGROUND

Semiconductor memory is an enabling component of almost all state-machine and processor-based electronic devices: TV's, computing systems, cell phones, pacemakers, coffee makers, and thousands of other devices. Semiconductor memory serves as an electronic scratchpad for controllers and processors of all sorts—enabling the storage and/or retrieval of information in binary form, which has either a temporarily persistence, i.e., retaining content while energy is available or a more permanent persistence by retaining content during periods when energy is not available. Static and dynamic random access memory, SRAM and DRAM respectively, are examples of memory in the first category, while flash memory, ROM, PROM, EPROM, MRAM, and FRAM memory are examples of memory in the second category (often called nonvolatile memory). Many devices utilize a combination of memory in both categories.

SRAM and DRAM memory are complex devices composed of memory cells to hold bits and ancillary circuits to read, write, and maintain the bits in the cells. Each cell contains one bit of information. An SRAM memory cell is often a configuration of transistors that can store a bit of information, while a DRAM memory cell may contain a semiconductor structure that can hold charge, commonly a capacitor but other structures may also be used to store a charge. The presence of a charge represents a bit value (1 or 0) and the absence of a charge represents an inverse value. A DRAM cell is functionally different from an SRAM cell in that a charge in a DRAM cell must be restored periodically by reading and rewriting the cell as the charge leaks away over time. This complication is offset by the fact that DRAM cells can be made much smaller than SRAM cells and thus can be made with much higher densities. A SRAM, on the other hand, is faster than a DRAM and uses less peripheral circuitry. A SRAM cell is a transistor circuit that can be in two states, each state representing a bit value. A SRAM cell maintains a state that represents a value of a bit as long as energy is available or until the state is changed by ancillary circuitry during a write operation.

Techniques to increase the density of SRAM's are an active area of development. To increase density, the dimensions of the semiconductor structures in SRAM's are often decreased, which decreases allowable mask alignment and other tolerances associated with photolithography during a manufacturing process and consequently increases the opportunities for defects. To ameliorate the effect of defects, spare cells are often incorporated into a memory and substituted for defective cells as needed during a test procedure following the manufacturing process. While this technique may increase the yield, the potential current load of the additional circuitry to effect a substitution of good cells for defective cells, and the potential current load imposed by defective cells remaining in the memory after being functionally replaced may be detrimental. An increased load on ancillary driver circuits can slow the operation of the circuits, increasing access time. Also energy consumption may increase, resulting in higher energy and cooling costs, higher temperatures, and decreased reliability.

SUMMARY

Exemplary embodiments of the present invention disclose a method and system for substituting a group of memory cells for a defective group of memory cells in a memory. In a step, an exemplary embodiment replaces a signal path to a group of defective memory cells with a signal path to a redundant group of memory cells. In another step, an exemplary embodiment isolates the signal path to the redundant group of memory cells from a load imposed by the signal path to the replaced group of defective memory cells.

DETAILED DESCRIPTION

Figure 1:
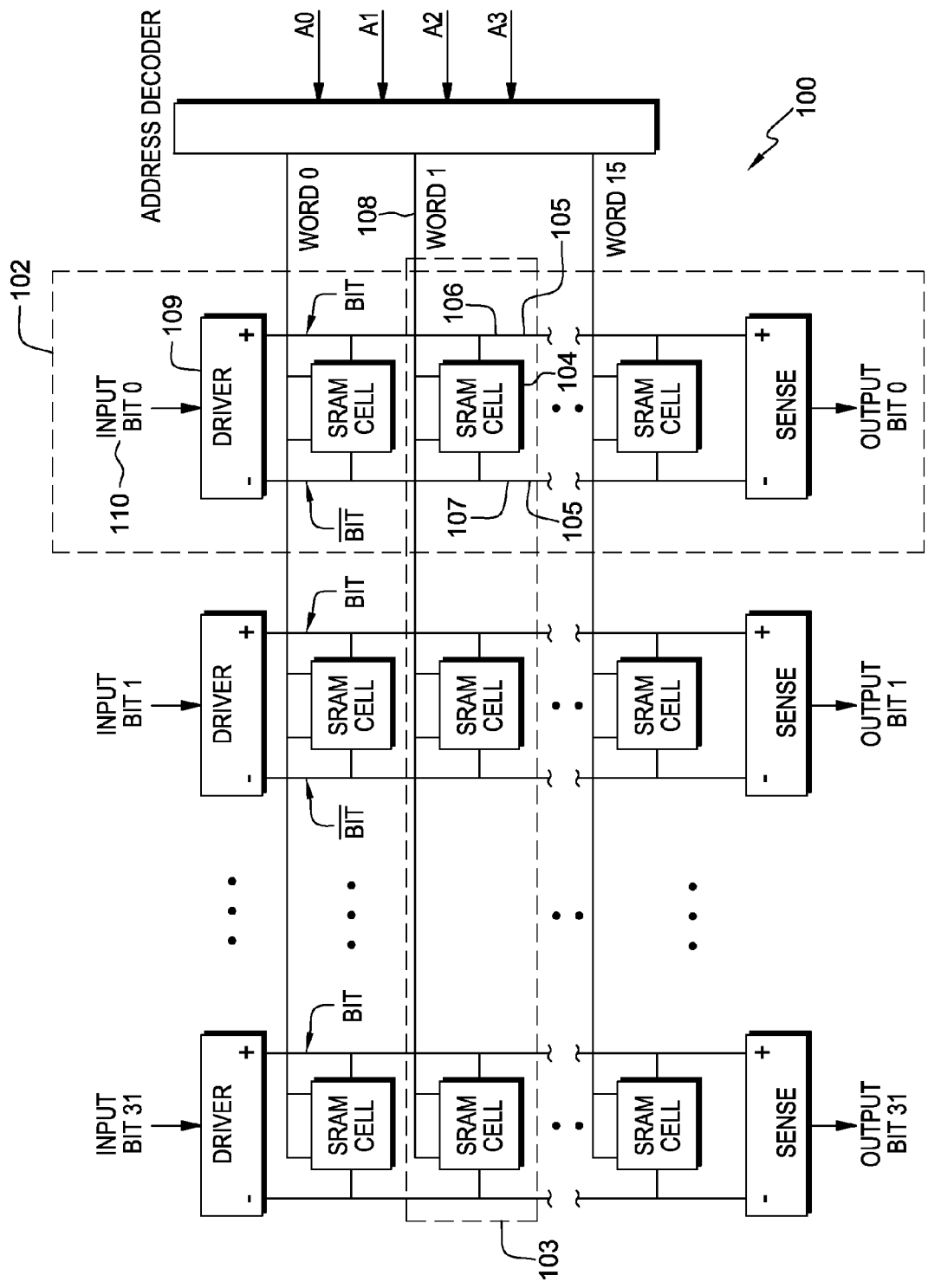
FIG. 1 is a block diagram showing an SRAM with functional units.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer-readable medium(s) having computer readable program code/instructions embodied thereon.

Any combination of computer-readable media may be utilized. Computer-readable media may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of a computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java®, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products not shown according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

An exemplary embodiment of the present invention is now described in detail with reference to the figures.

An SRAM memory cell, or cell, is a bistable flip-flop in one of two states interpreted by a support circuitry to be either logic 1 or logic 0, and can store one bit of data. SRAM cells are often organized into one or more rectangular arrays, each array having columns and rows as in a matrix, often with one column for each bit of data in an SRAM's I/O interface. An SRAM with a 32-bit wide I/O interface usually has 32 columns in one or more arrays. A row of cells in an array stores a word of data and all the cells in a row are usually accessed concurrently, i.e., one word is accessed concurrently.

An example SRAM 100, depicted in FIG. 1, can store 512 bits in an array of cells with 16 rows and 32 columns. SRAM 100 has 32-bit I/O with 32 cells (e.g., receiving respective bits of input bit 0, and input bit 1 through input bit 31, and outputting respective bits of output bit 0, and output bit 1 through output bit 31) in each row and 16 cells in each column. Cell 104 in SRAM 100 is one of 16 cells in column 102 and one of 32 cells in row 103. All 32 cells in row 103 are accessed concurrently during a read or write operation. In general, a column may include many cells and have a length limited by operating voltage, desired access time, device geometry, and achievable cell density.

Two signal lines that each carry a logic value such that the two logic values together represent one bit of information is a signal line pair. All 16 cells in column 102 are connected to a common signal line pair, bitline pair 105. There is a unique bitline pair associated with each column in an array. Individual bitlines in a bitline pair are called bit line and $\overline{bit}$ line. Bitline pair 105 includes bitline 106, a bit line, and bitline 107, a $\overline{bit}$ line. In general, a bitline pair represents a value of a bit with two potentials, one on each of the two bitlines in the bitline pair. When a bitline pair is active, one bitline of the bitline pair is at ground potential and one bitline of the bitline pair is at a higher potential or voltage. For example, an assertion of a voltage on the bit line of a bitline pair and a ground on the $\overline{bit}$ line of the bitline pair may represent logic 1, whereas an assertion of ground on the bit line of the bitline pair and a voltage on the $\overline{bit}$ line of the bitline pair may represent logic 0. A representation of a single input signal as a difference in voltage between two input signals is called a differential input. SRAMs have differential input and differential output via bitline pairs. A bitline pair driver circuit asserts potentials on a bitline pair, and asserts appropriate potentials on each cell in a column of cells concurrently. There is a bitline pair driver for each bitline pair.

In an SRAM, cells in a row are connected to a common signal line called a wordline, with a unique word line for each row in an array. For example, wordline 108 is connected to each cell in row 103 in SRAM 100. Specific words (e.g., word 0, and word 1 through word 15) of data are selected in an SRAM by decoding an address given to the SRAM into a specific bitline pair and a specific wordline (e.g., A0, A1, A2, and A4 of an address decoder) and activating the resulting specific bitline pair and the specific wordline, to access a word of cells at the address given to the SRAM.

In an exemplary embodiment, SRAM 100 operates in a following manner. In general, during a write of a word of data to a memory address, each bit in the word is routed to an input of a bitline pair driver connected to a bitline pair. For example, data bit 110 is routed to bitline pair driver 109 that drives bitline pair 105. If bit 110 to be written is logic 1, a bitline pair driver generates sufficient current, i.e., pump sufficient charge into a bitline, so that an accumulation of charge on one bitline results in a voltage on the bitline, and concurrently imposes ground on one bitline in the bitline pair. If a bit to be written is logic 0, the bitline pair driver may assert logic 0 on the bitline pair by asserting an appropriated potential on each bitline in the bitline pair. After logic levels on bitline pairs (one pair for each column) stabilize during the write operation, an appropriate wordline is pulsed, i.e., the potential of the wordline is raised from ground to a voltage for a specific duration and then returned to ground, causing each bit on each bitline pair to be latched into each cell attached to the wordline.

During a read of a word from a memory address, both bitlines in bitline pairs are filled with charge by bitline pair drivers, thus raising a potential of both bitlines. This causes the appropriate wordline to be pulsed, rising from ground to an appropriate potential for a specific duration and then returning to ground. During the period that the wordline is at an appropriate potential above ground, the potential of one line in each bitline pair is pulled down to ground potential by a memory cell. A resulting difference in potential between bitlines in a bitline pair is detected and latched.

SRAM cells are generally much larger than DRAM cells and therefore there is considerable interest in techniques that increase a density of SRAM's. Scaling down dimensions of SRAM structures is a technique often used to increase density, with a disadvantage of a tightening of manufacturing process tolerances which in turn may result in a lower yield of acceptable devices. Yield may be improved by including spare columns of cells in an SRAM that can be functionally swapped for faulty columns during a post manufacturing process. Functionally swapped means that a faulty column remains in the SRAM but all inputs, outputs, and controls to/from the faulty column are connected to a known good column. An approach to incorporating a spare column into an SRAM is to add a spare column of cells at one end of an array of columns. A spare column at a left end of an array, for example, enables a function of a defective column in any position to be replaced by shifting a functionality of all columns left by one position, beginning with the defective column.

Figure 2:
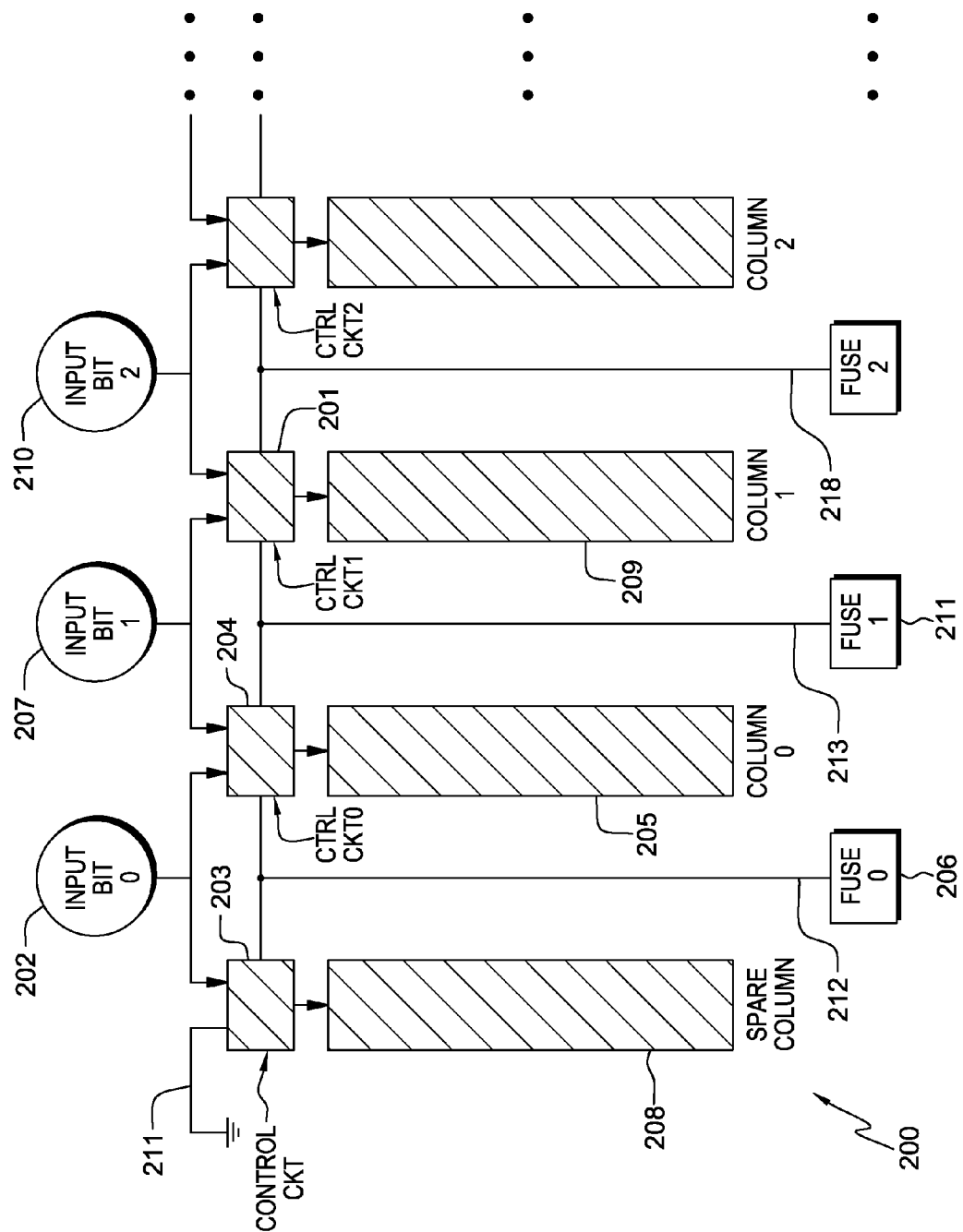
FIG. 2 is a block diagram showing functional units in an exemplary embodiment.

In an exemplary embodiment, FIG. 2 depicts a portion of an SRAM array 200 in which a functionality of a faulty column may be swapped for a functionality of a spare column. An arrangement of columns depicted in FIG. 2 includes spare column 208 on the left side of array 200. Inputs to array 200 are routed to columns via a control circuit connected to each column (e.g., CONTROL CKT, CRTL CKT0, CTRL CKT1, CTRL CKT2). Each input bit to the array is an input to two control circuits, one connected to each of two adjacent columns. A control circuit selects one of two input bits and routes a selected input bit to a column. In an exemplary embodiment, input bit 202 (e.g., input bit 0) is connected to control circuit 203 and control circuit 204. Control circuit 203 may route input bit 202 or ground input 211 to spare column 208. Control circuit 204 may route input bit 202 or input bit 207 (e.g., input bit 1) to column 205 (e.g., column 0). Input bit 207 is connected to control circuit 204 and control circuit 201. Control circuit 201 may route an input bit 207 or input bit 210 (e.g., input bit 2) to column 209 (e.g., column 1, column 2, etc.).

Figure 3:
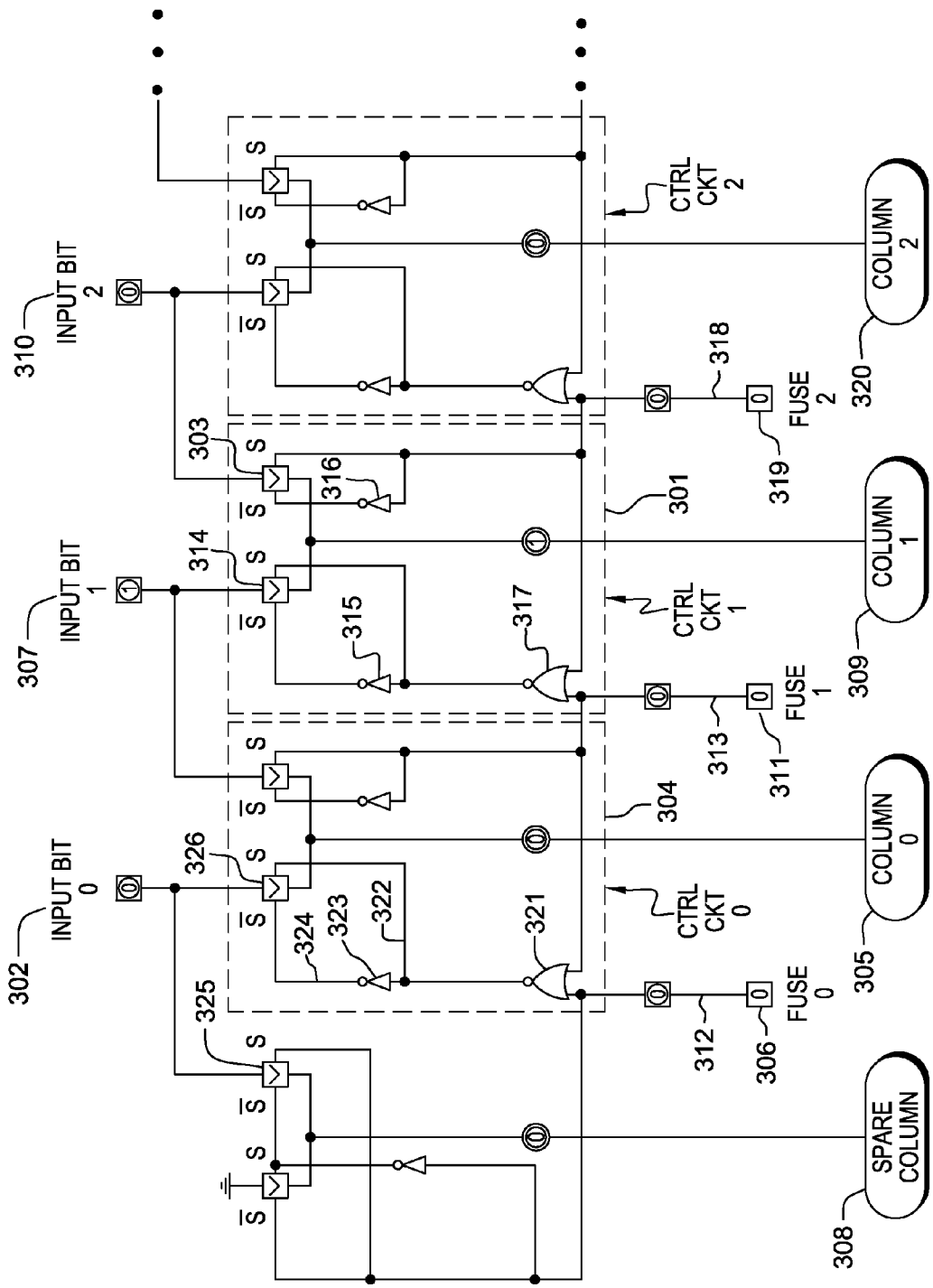
FIG. 3 shows logic in an exemplary embodiment of control circuits depicted in FIG. 2.

In exemplary embodiments, control circuits may shift a functionality of a column to an adjacent column. In examples, a state of two control lines that are connected to a control circuit determines which of two input bits to the control circuit is routed to a column. A state of a fuse (e.g., fuse 0, fuse 1, and fuse 2) determines whether a ground or a voltage is applied to a control line that is connected to a control circuit. In an exemplary embodiment, a state of fuse 206 controls whether ground or a voltage is on control line 212 which is connected to control circuit 203 and control circuit 204. In an exemplary embodiment, a design of control circuit 304 and control circuit 301 (e.g., CRTL CKT0, CTRL CKT1, CTRL CKT2 in FIG. 3 or 4) is shown in FIG. 3. Control circuit 301 reveals a detail of control circuit 201 and includes transmission gate 314, transmission gate 303, inverter 315, inverter 316 and NOR gate 317. A transmission gate acts as a switch that may or may not pass an input to an output, depending on whether the transmission gate is closed or open respectively. In an exemplary embodiment, a design of control circuit 304 and control circuit 301 is shown in FIG. 3. Control circuit 301 reveals a detail of control circuit 201 and includes transmission gate 314, transmission gate 303, inverter 315, inverter 316 and NOR gate 317. A transmission gate acts as a switch that may or may not pass an input to an output, depending on whether the transmission gate is closed or open respectively.

In FIG. 3, a transmission gate is represented as a square symbol with a "v" inside the square. A transmission gate has two selects, $\overline{S}$ and S, that control whether an input to the transmission gate is felt on the output of the transmission gate (when $\overline{S}$ is logic 0 and S is logic 1) or not felt on the output of the transmission gate (when $\overline{S}$ is logic 1 and S is logic 0). In FIG. 3, $\overline{S}$ is shown on the left side of transmission gates 303 and 314 and S is shown on the right side of transmission gates 303 and 314.

During a test process a functionality of a faulty column may be replaced by a functionality of a spare column by blowing one or more appropriate fuses to assert appropriate logic values on one or more control circuits, thereby routing an input data bit to an appropriate column. Control circuit 301 (control circuit 201) can route input bit 307 (input bit 207) or input bit 310 (input bit 210) to column 309 (column 209) depending on a logic value on control line 318 (control line 218) and on control line 313 (control line 213). Generally, a logic value on a control line is controlled by a state of a fuse attached to the control line. In exemplary embodiments, logic 0 is asserted on the control line if the fuse is intact (not blown) and logic 1 is asserted on the control line if the fuse is blown. A state of a fuse may be left intact or blown during a test process after manufacturing an SRAM. In an example, a state of fuse 311 (fuse 211) controls a logic value on control line 313 (control line 213).

If during a test process, column 305 (e.g., column 0 in FIG. 3 or 4), column 309 (e.g., column 1 in FIG. 3 or 4), and column 320 (e.g., column 2 in FIG. 3 or 4) are found to be operational, fuse 306 (e.g., fuse 0), fuse 311 (e.g., fuse 1), and fuse 319 (e.g., fuse 2) are intact. If fuse 306, fuse 311, and fuse 319 are intact, input bit 302 (e.g., input bit 0 in FIG. 3 or 4) is routed to column 305, input bit 307 (e.g., input bit 1 in FIG. 3 or 4) is routed to column 309, and input bit 310 (e.g., input bit 2 in FIG. 3 or 4) is routed to column 320. If during a test process, column 305 is found faulty, and column 309 and column 320 are found operational, fuse 306 is blown, and fuse 311 and fuse 319 are intact. When fuse 306 is blown, logic 1 is felt on signal line 312 which causes logic 0 to be felt on $\overline{S}$ of transmission gate 325 and logic 1 to be felt on S of transmission gate 325, causing transmission gate 325 to conduct and route input bit 302 to spare column 308. If fuse 306 is blown, and fuse 311 and fuse 319 are intact, input bit 302 is routed to spare column 308, input bit 307 is routed to column 309, and input bit 310 is routed to column 320. A functionality of faulty column 305 is therefore assumed by spare good column 308.

In exemplary embodiments when fuse 306 is blown, load isolation takes place in addition to a rerouting of input bit 302. A load of faulty column 305 is not felt by input bit 302 because transmission gate 326 is turned off. Because fuse 306 is blown, fuse 306 asserts logic 1 on an input to NOR gate 321 which consequently asserts logic 0 on signal line 322. Logic 0 is felt on an input to inverter 323, which outputs logic 1 on signal line 324. An assertion of logic 0 on S input to transmission gate 326 and an assertion of logic 1 on $\overline{S}$ input to transmission gate 326 causes transmission gate 326 to act as an open switch, thus a load caused by faulty column 305 is isolated from a driver that drives input bit 302.

Figure 4:
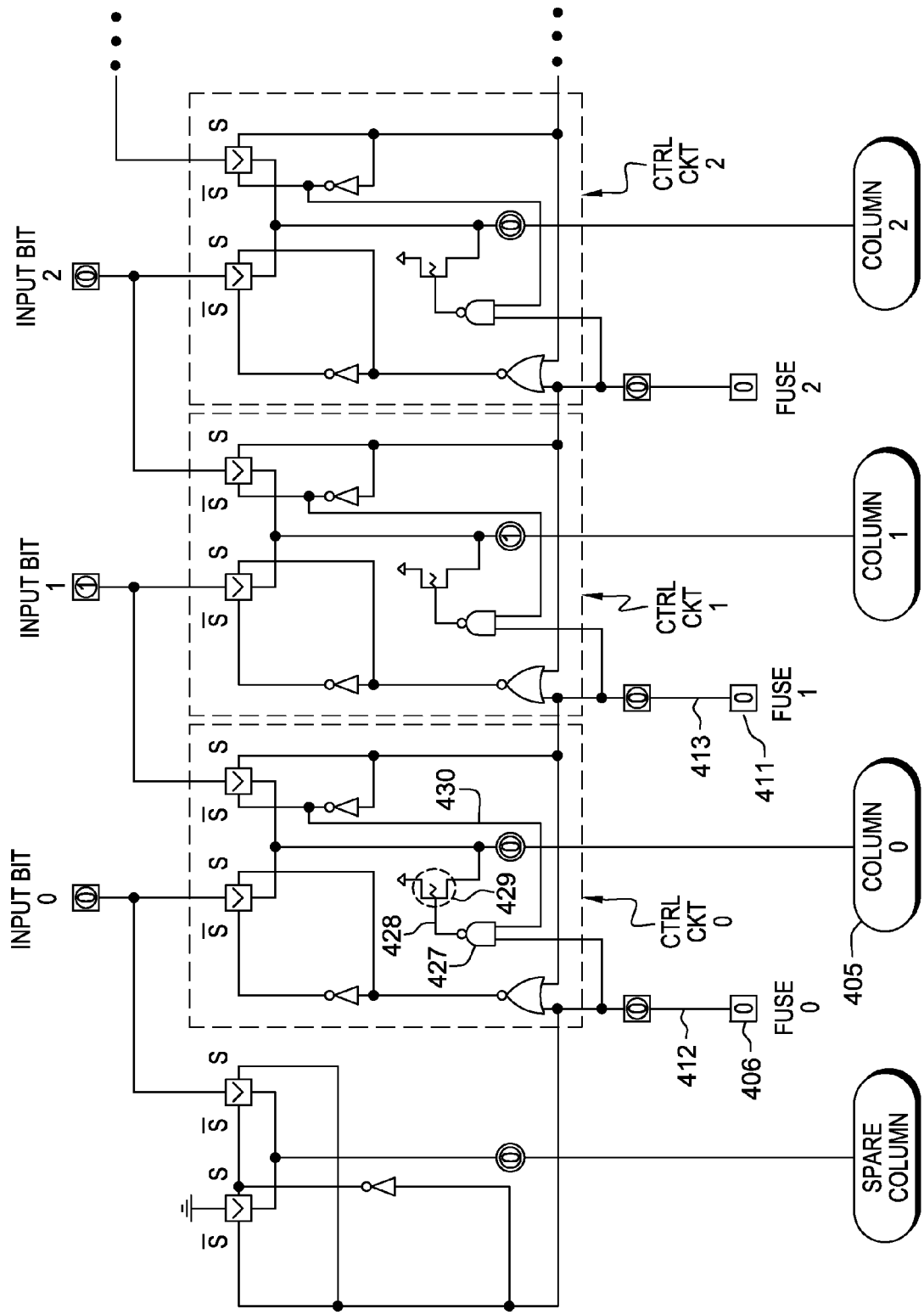
FIG. 4 shows logic in an alternative exemplary embodiment of the control circuits depicted in FIG. 2.

In another exemplary embodiment, depicted in FIG. 4, a column of replaced cells is tied to ground potential. In this exemplary embodiment, additional circuitry is associated with each column of cells depicted in FIG. 3, an additional NAND gate and an additional transistor. For example, in FIG. 4, NAND 427 and transistor 429 is associated with column 405. If column 405 is found to be faulty and is replaced, fuse 406 (e.g., fuse 0) is blown, asserting logic 1 on signal line 412. Fuse 411 (e.g., fuse 1, fuse 2) asserts logic 0 on signal line 413 which causes logic 1 on signal line 430. Logic 1 on signal lines 430 and 412 cause NAND 427 to assert logic 0 on signal line 428, causing transistor 429 to conduct and pull column 405 to ground.

Therefore, in exemplary embodiments, a design of a control circuit not only reroutes an input bit routed to a faulty column to a good column but conditions a transmission gate on the faulty column to isolate a load from the faulty column. Exemplary embodiments of the present invention allow isolation of a load of a replaced faulty column and enable an input bit driver designed to drive a load of one column (an operational column) instead designed to drive a load of two columns (a faulty column and an operational column). In an exemplary embodiment a potential of replaced column of cells is not tied to ground or to a voltage and in another exemplary embodiment a potential of replaced column of cells is tied to logic 1, to decrease a possible detrimental effect on SRAM circuitry. The isolation feature enables an SRAM to operate faster, consume less die area, and consume less energy than an SRAM having an input bit driver designed to drive a load of two columns of memory cells.

The forgoing description is are example embodiments only, and those skilled in the art understand that any signal may be carried on a rerouted signal line, that a memory cell may be implemented in many ways and in many technologies, and that a number of rows and columns in a memory and a size of a memory is immaterial to the invention.

Techniques that enable a substitution of good cells for defective cells in an SRAM with little or no consequential increase in energy consumption and access time are valued.

What is claimed is:

1. A system for substituting a group of memory cells in a memory, the system comprising:
   one or more groups of memory cells;
   one or more redundant groups of memory cells;
   circuit to replace a signal path to a defective group of memory cells with a signal path to a redundant group of memory cells;
   circuit to isolate the signal path to the redundant group of memory cells from a load imposed by the signal path to the defective group of memory cells that has been replaced;
   wherein the system is operable to:
   replace the signal path to a group of defective memory cells with the signal path to a redundant group of memory cells;
   isolate the signal path to the redundant group of memory cells from a load imposed by the replaced signal path to the group of defective memory cells; and
   in response to blowing a fuse, triggering a logic transmission gate to cause a transistor to conduct and pull the replaced signal path to the group of defective memory cells to ground.

2. The system of claim 1, wherein the memory is a semiconductor memory.

3. The system of claim 2, wherein the semiconductor memory is an SRAM.

4. The system of claim 2, wherein the semiconductor memory is a DRAM.

5. The system of claim 1, wherein the signal paths are input signal paths.

6. The system of claim 5, wherein the memory is a semiconductor memory.

7. The system of claim 6, wherein the semiconductor memory is an SRAM.

8. The system of claim 6, wherein the semiconductor memory is a DRAM.

9. The system of claim 1, wherein the defective group of memory cells are connected to a ground potential.

10. The system of claim 1, wherein the logic transmission gate is a NAND logic transmission gate.

11. A method for substituting a group of memory cells in a memory, the method comprising the steps of:
    replacing a signal path to a group of defective memory cells with a signal path to a redundant group of memory cells;
    isolating the signal path to the redundant group of memory cells from a load imposed by the replaced signal path to the group of defective memory cells; and
    in response to blowing a fuse, triggering a logic transmission gate to cause a transistor to conduct and pull the replaced signal path to the group of defective memory cells to ground.

12. The method of claim 11, wherein the memory cells in the replacing and isolating steps are semiconductor memory.

13. The method of claim 12, wherein the semiconductor memory cells in the replacing and isolating steps are SRAM.

14. The method of claim 12, wherein the semiconductor memory cells in the replacing and isolating steps are DRAM.

15. The method of claim 11, wherein the signal paths in the replacing and isolating steps are input signal paths.

16. The method of claim 15, wherein the memory cells in the replacing and isolating steps are semiconductor memory.

17. The method of claim 16, wherein the semiconductor memory cells in the replacing and isolating steps are SRAM.

18. The method of claim 16, wherein the semiconductor memory cells in the replacing and isolating steps are DRAM.

19. The method of claim 11, wherein the defective group of memory cells are connected to a ground potential.

20. The method of claim 11, wherein the logic transmission gate is a NAND logic transmission gate.

* * * * *